United States Patent [19]

Toda et al.

[11] Patent Number: 4,734,233
[45] Date of Patent: Mar. 29, 1988

[54] CERAMIC WIRING SUBSTRATE AND PROCESS FOR PRODUCING THE SAME

[75] Inventors: Gyozo Toda, Hino; Takashi Kuroki, Yokohama; Shousaku Ishihara, Chigasaki; Tsuyoshi Fujita, Yokohama; Naoya Kanda, Yokohama, all of Japan

[73] Assignee: Hitachi, Ltd., Tokyo, Japan

[21] Appl. No.: 7,088

[22] Filed: Jan. 27, 1987

[30] Foreign Application Priority Data

Jan. 27, 1986 [JP] Japan .................... 61-13809

[51] Int. Cl.4 .................. C04B 33/32; H05K 3/12
[52] U.S. Cl. ............................ 264/61; 264/65; 427/96; 427/126.2; 427/376.2; 428/209; 428/210; 428/901; 501/69
[58] Field of Search ............... 264/56, 65, 60–62; 427/96, 123, 126.2, 126.4, 376.1, 376.2, 383.5; 428/209, 210, 901; 501/69

[56] References Cited

U.S. PATENT DOCUMENTS

| | | | |
|---|---|---|---|
| 3,615,763 | 10/1971 | Flock | 264/61 X |
| 3,857,923 | 12/1974 | Gardner et al. | 264/61 X |
| 4,159,295 | 6/1979 | Mazzuchelli et al. | 264/61 X |
| 4,313,900 | 2/1982 | Gonzales, Jr. et al. | 264/61 |
| 4,345,955 | 8/1982 | Bakermans et al. | 264/61 X |
| 4,397,800 | 8/1983 | Suzuki et al. | 264/61 |
| 4,510,000 | 4/1985 | Kumar et al. | 427/96 X |
| 4,521,449 | 6/1985 | Arnold et al. | 264/61 X |
| 4,551,357 | 11/1985 | Takeuihi et al. | 427/96 |
| 4,574,094 | 3/1986 | DeLuca et al. | 427/96 |
| 4,620,264 | 10/1986 | Ushifusa et al. | 428/209 X |
| 4,624,896 | 11/1986 | Watanabe et al. | 428/209 X |
| 4,632,846 | 12/1986 | Fujinaka et al. | 264/61 X |
| 4,649,125 | 3/1987 | Takeuchi et al. | 264/61 X |
| 4,678,683 | 7/1987 | Pasco et al. | 427/96 X |
| 4,684,446 | 8/1987 | Charles et al. | 427/96 X |
| 4,695,504 | 4/1987 | Watanabe et al. | 428/209 |

*Primary Examiner*—Tom Wyse
*Attorney, Agent, or Firm*—Antonelli, Terry & Wands

[57] ABSTRACT

A ceramic wiring substrate and a process for producing the same having a conductive layer, obtained by sintering a conductive paste comprising 85 to 97% by weight of a tungsten powder and 15 to 3% by weight of a sintering additive (for conductive metal) having a specified composition, on a mullite ceramic substrate.

8 Claims, 4 Drawing Figures

CERAMIC WIRING SUBSTRATE AND PROCESS FOR PRODUCING THE SAME

BACKGROUND OF THE INVENTION

This invention relates to a ceramic wiring substrate and a process for producing the same. More particularly, the present invention is concerned with a mullite ceramic wiring substrate having a wiring conductor which is dense and exhibits a high metallizing strength and a process for producing the same.

In recent years, with high integration of semiconductor devices, ever-increasing requirements for higher density wiring, higher performance and higher reliability have been made to wiring substrates mounting such devices. Particularly, a great task with respect to wiring substrates used for computers etc. is to attain a higher rate of signal propagation and a higher reliability.

As a ceramic for such wiring substrates, a ceramic composed mainly of alumina ($Al_2O_3$) has already been put to practical use. However, such a ceramic is accompanied by a fundamental problem that the rate of signal propagation is low due to a high dielectric constant of alumina. On the other hand, substrates prepared by using ceramics having a low dielectric constant have recently been developed, and mullite ceramics among them are now attracting a particular attention.

However, the use of mullite ceramics as a wiring substrate brings about the following problems:

(1) Since mullite ceramics hardly react with high-melting metals such as tungsten and molybdenum in a reducing atmosphere, the adhesion between mullite ceramics and these metals are extremely low. In this connection, it is noted that W. M. Kriven and Joseph A. Pask submitted an article entitled "Solid Solution Range and Microstructures of Melt-Grown Mullite" to Journal of the American Ceramic Society, Vol. 66, p. 649. The authors conducted experiments on melting of a pure mullite using a crucible made of molybdenum and proved that molybdenum and the mullite do not chemically react with each other even at a temperature corresponding to or exceeding the melting point of mullite. Since the chemical properties of tungsten are substantially the same as those of molybdenum, tungsten does not chemically react with mullite either. The present inventors also have confirmed experimentally such reactivity between molybdenum or tungsten and mullite, i.e., confirmed that neither molybdenum nor tungsten reacted with mullite at a temperature of 1750° C. or lower.

It is essential for a ceramic wiring substrate that a ceramic is strongly bonded to a conductor on the surface of the wiring substrate, e.g., at signal input and output terminals or IC chip-connecting terminals. In an alumina wiring substrate, such a strong bonding has conventionally been attained by the following method.

Specifically, an alumina wiring substrate having a metallic tungsten conductor distributed thereon is heated to the sintering temperature thereof, causing the melting of a sintering additive which has been added to the alumina. The molten sintering additive penetrates into the voids in the conductive layer made of tungsten in the next stage. By penetration of such a molten sintering additive, tungsten can, for the first time, be integrated with alumina, thus leading to the formation of a strong bonding therebetween.

As mentioned above, a mullite ceramic chemically reacts with neither tungsten nor molybdenum. But, it is expected that a mullite ceramic could be strongly bonded to a conductive metal through proper selection of a sintering additive capable of penetrating into a conductor layer made of molybdenum or tungsten, as in the above-mentioned alumina.

Figure 1:
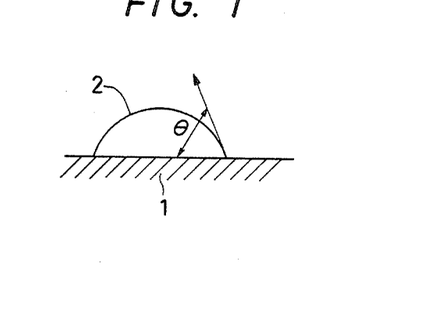
FIG. 1 is an illustrative view showing wettability between a solid and a liquid.

However, in conventional mullite substrates, a sintering additive which has been added to the mullite ceramic does not exhibit sufficient melting and penetration into a conductive metal layer at its sintering temperature. In order to attain the penetration of sufficient amount of the molten sintering additive into the conductive metal layer, it is necessary for the surface of the conductive metal to be wetted with the molten sintering additive. The angle between a solid 1 and a liquid 2 (contact angle $\theta$) as shown in FIG. 1 is ordinary used as a measure of wettability. In general, when the angle $\theta$ is greater than 90° C., the solid is considered not to be wetted while when the angle $\theta$ is smaller than 90° the solid is considered to be wetted. For mullite ceramics, an angle $\theta$ smaller than about 10° is required for bonding a ceramic to a conductive metal in a manner similar to the permeation of a sintering additive in the case of an alumina substrate.

However, the contact angle $\theta$ between tungsten or molybdenum and a sintering additive which has been employed in the conventional mullite ceramics is relatively large, i.e., about 20° to 40°. Therefore, it is difficult for a sufficient amount of the sintering additive to penetrate in a molten state into a conductive metal layer distributed on the mullite ceramic substrate, which causes lowering in the strength of bonding between the mullite and the conductive metal or causes scattering of bonding strength.

(2) When heated to a sintering temperature of the mullite ceramic substrates, the mullite ceramic is densified sufficiently, whereas metals having a high melting point, such as tungsten or molybdenum, is not densified sufficiently and still has a relatively porous microstructure.

If the conductive layer formed on the surface of the wiring substrate is porous, serious problems arise during subsequent treatments of the substrate. For example, during a plating treatment of the substrate, a plating solution permeates into the conductive layer to cause swelling, peeling, oxidation and discoloration of the film formed by plating. Therefore, the conductor layer formed on the surface of the ceramic substrate must be dense to such an extent that the plating solution cannot permeate thereinto.

However, since in conventional mullite substrates, the sintering additive does not sufficiently penerate into the conductor layer at the sintering temperature, as mentioned above in item (1), pinholes are present particularly in the conductive layer formed on the surface of the mullite ceramic, which renders the mullite substrates water absorptive.

SUMMARY OF THE INVENTION

It is an object of the present invention to provide a ceramic wiring substrate which is sufficiently high in strength of the bonding between the ceramic and the conductive metal and has a dense conductive metal layer.

It is another object of the present invention to provide a process for producing a ceramic wiring substrate of the kind as mentioned above.

DETAILED DESCRIPTION OF THE PREFERRED EMBODIMENTS

The present invention has been made based on the development of a novel composition which is capable of sufficiently sintering and densifying a conductive metal having a high melting point (2500° C. or higher), such as tungsten or molybdenum, at the sintering temperature of a mullite ceramic and capable of strongly bonding the mullite ceramic to the conductive metal.

Now, a basic concept of the present invention will be described briefly. Specifically, the sintering additive for tungsten and molybdenum should meet the following requirements.

(1) In order to attain a strong bonding between a conductive metal and a mullite ceramic, it is necessary that a sintering additive for mullite ceramic and a sintering additive for conductive metal be relatively similar in chemical composition.

(2) The melting temperature of a sintering additive for conductive metal should be lower than that of a mullite ceramic. In other words, the sintering additive present in the conductive metal layer should be in a molten state at the sintering temperature of the mullite substrate to attain a densified conductive metal layer.

The sintering additive for conductive metal which meets the above-mentioned requirements is first mixed with a conductive metal and then applied onto a mullite ceramic substrate to form a wiring by a customary method used for general conductive pastes for a ceramic wiring substrate, followed by sintering. Hence, the mechanism of bonding and densification in the present invention is quite different from conventional one in which the bonding between a ceramic and a conductive metal and the densification of a conductive metal layer are made by penetration of a molten sintering additive into the conductive metal layer from the side of the ceramic.

Figure 2:
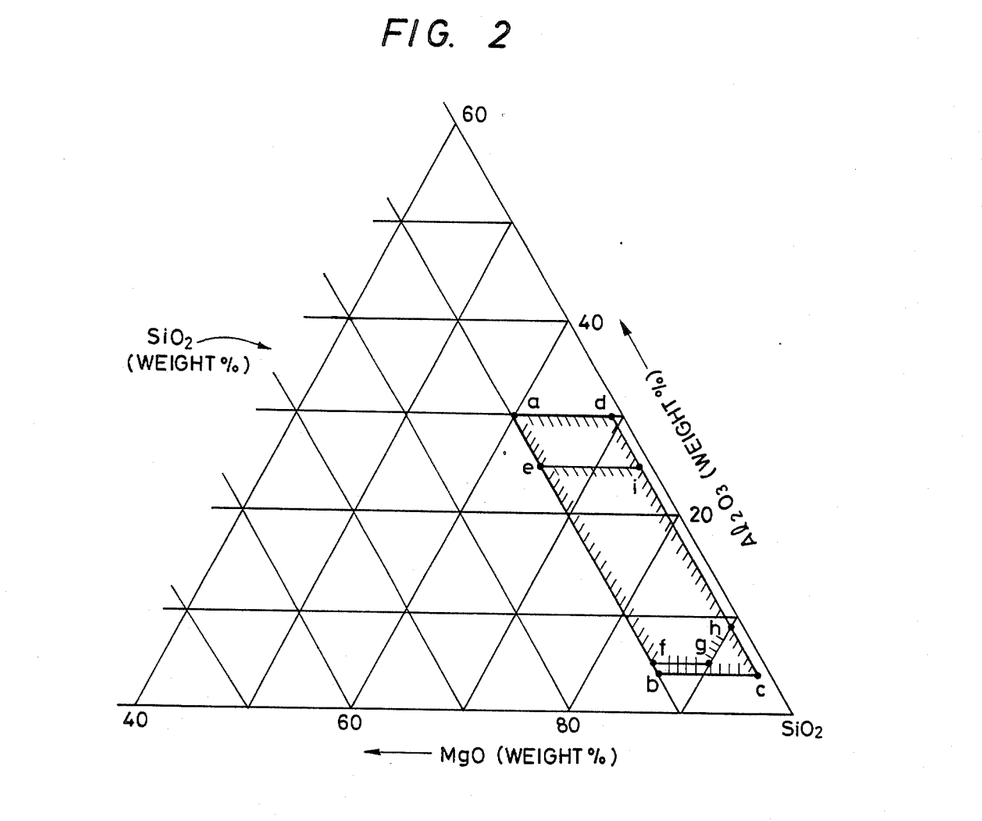
FIG. 2 is a triangular diagram showing a composition range of a sintering additive for mullite.
Figure 3:
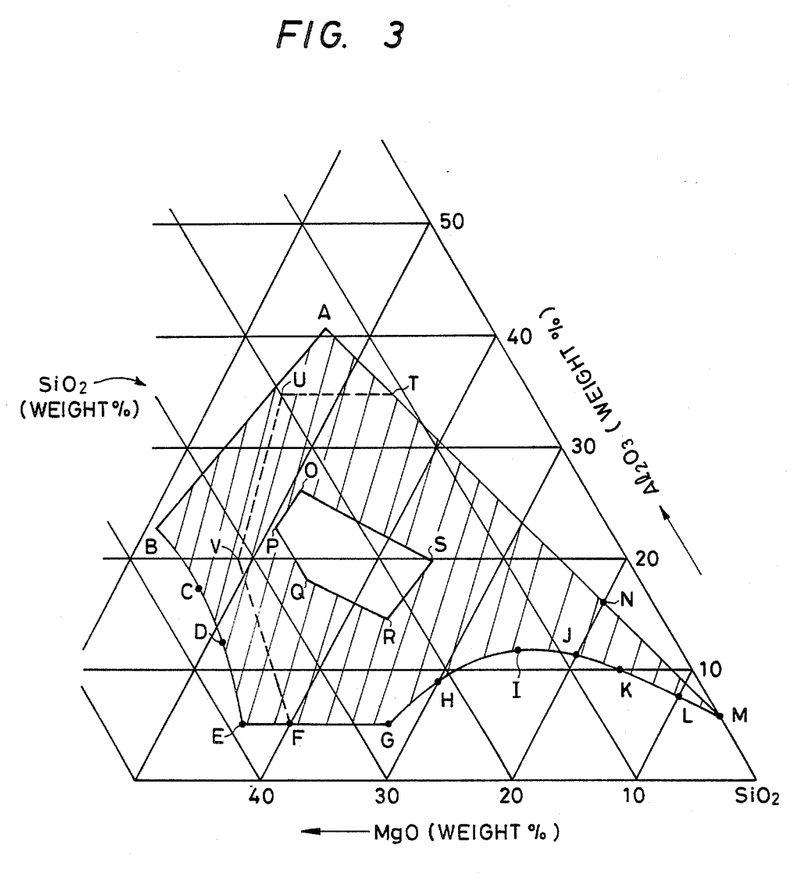
FIG. 3 is a triangular diagram showing a composition range of a sintering additive for conductive metal.

The above requirements can be met and, at the same time, the above object can be attained by preparing a ceramic wiring substrate by a process which comprises a step of conducting printing on a mullite green sheet consisting essentially of a pure mullite (generally represented by the formula $3Al_2O_3 2SiO_2$) and a sintering additive for mullite which is an amorphous $SiO_2$-$Al_2O_3$-MgO sintering additive having a composition falling within the area surrounded by the lines connecting points a, b, c and d in a triangular diagram as shown in FIG. 2 (wherein the above points a through d represent compositions as will be given later) with a conductive paste comprising 85 to 97% by weight of a tungsten powder or 75 to 95% by weight of a molybdenum powder and 15 to 3% by weight or 25 to 5% by weight of a sintering additive for conductive metal having a composition falling within the range surrounded by the lines connecting points A, B, C, D, E, F, G, H, I, J, K, L, M and N and the lines connecting points O, P, Q, R and S in a triangular diagram as shown in FIG. 3 (wherein the above points A though S represent compositions as will be given later), and a step of sintering the printed sheet in a reducing atmosphere of 1550° to 1700° C. Preferred proportions of tungsten and molybdenum to be incorporated are 90 to 95% by weight and 83 to 90% by weight, respectively. The preferred balances with respect to molybdenum and tungsten are preferably 10 to 5% by weight and 17 to 10% by weight of a sintering additive for conductive metal having a composition falling within the range surrounded by the lines connecting A through N and the lines connecting O through S.

|   | $SiO_2$ (wt %) | $Al_2O_3$ (wt %) | MgO (wt %) |
| --- | --- | --- | --- |
| a | 60 | 30 | 10 |
| b | 86 | 4 | 10 |
| c | 95 | 4 | 1 |
| d | 69 | 30 | 1 |
| A | 46 | 41 | 13 |
| B | 41 | 22.5 | 36.5 |
| C | 47 | 17 | 36 |
| D | 51 | 12 | 37 |
| E | 56 | 5 | 39 |
| F | 60 | 5 | 35 |
| G | 67 | 5 | 28 |
| H | 70 | 9 | 21 |
| I | 75 | 12 | 13 |
| J | 80 | 12 | 8 |
| K | 84 | 10 | 6 |
| L | 90 | 7.5 | 2.5 |
| M | 95 | 5 | 0 |
| N | 80 | 16 | 4 |
| O | 51 | 26 | 23 |
| P | 50.5 | 23 | 26.5 |
| Q | 55.5 | 18 | 26.5 |
| R | 63 | 15 | 22 |
| S | 64 | 20 | 16 |

A preferred sintering additive for mullite has a composition falling within the range surrounded by the lines connecting points e, f, g, h and i in the triangular diagram as shown in FIG. 2.

|   | $SiO_2$ (wt %) | $Al_2O_3$ (wt %) | MgO (wt %) |
| --- | --- | --- | --- |
| e | 65 | 25 | 10 |
| f | 85 | 5 | 10 |
| g | 90 | 5 | 5 |
| h | 90 | 9 | 1 |
| i | 74 | 25 | 1 |

The above-mentioned sintering additive for conductive metal preferably has a composition falling within the range surrounded by the lines connecting points T, U, V, F, G, H, I, J and N and the lines connecting points, O, P, Q, R and S. The above-mentioned points T, U, V, F, G, H, I, J and N represent compositions as shown below.

|   | $SiO_2$ (wt %) | $Al_2O_3$ (wt %) | MgO (wt %) |
| --- | --- | --- | --- |
| T | 53 | 35 | 12 |
| U | 44 | 35 | 21 |
| V | 45 | 20 | 35 |
| F | 60 | 5 | 35 |
| G | 67 | 5 | 28 |
| H | 70 | 9 | 21 |
| I | 75 | 12 | 13 |
| J | 80 | 12 | 8 |
| N | 80 | 16 | 4 |

The use of any composition outside the range mentioned above does not lead to the achievement of the object of the present invention.

Mullite has a melting point higher than 1800° C. Therefore, in order to densify mullite alone by sintering, it is necessary to treat the mullite substrate at a temperature much higher than the temperature range of 1550° to 1700° C. which is a sintering temperature range for conventional ceramic substrates. Sintering of mullite at a temperature of 1550° to 1700° C. requires the presence of sintering additive comprising an $SiO_2$-$Al_2O_3$-MgO amorphous composition as shown in FIG. 2.

Such a sintering additive is advantageous in that it does not sacrifice excellent properties of mullite.

The $SiO_2$-$Al_2O_3$-MgO composition as shown in FIG. 3 is suitable as a sintering additive for conductive metal used for a mullite substrate according to the present invention. If the sintering additive for mullite is remarkably different from the one for conductive metal in its basic composition, both the sintering additive compositions react with each other in a complicated manner during sintering, which adversely affects dimensional accuracy of the sintered substrate and stability of the process to a great extent and causes warp of the sintered substrate.

It is required that the melting temperature of the sintering additive for conductive metal be by at least 100° C. lower than the sintering temperature (1550° to 1700° C.) of the mullite substrate. Such a melting temperature is necessary to sufficiently densify and sinter the conductive metal layer at the sintering temperature of the mullite substrate to make the conductive metal layer airtight. If the melting temperature of the sintering additive for conductive metal is too close to the sintering temperature of the mullite substrate, densification of the conductive metal layer does not proceed satisfactorily. This is so because the shrinkage curve of mullite is basically in disagreement with that of the conductive metal. In view of the above, the melting temperature of the sintering additive for conductive metal is limited to a temperature of 1600° C. or lower which is a temperature by at least 100° C. lower than the maximum sintering temperature for mullite.

The lower limit of the melting temperature of the sintering additive for conductive metal depends on the temperature at which the sintering of the mullite ceramic according to the present invention takes place rapidly. In other words, in a wiring substrate comprising a ceramic and a metal according to the present invention, it is required that the shrinkage curve of the ceramic and that of the metal when heating the substrate be in agreement with each other. If the shrinkage curve of the both materials do not agree, each material shrinks independently during sintering, which causes shrinkage to a different extent, which in turn makes it impossible to obtain a wiring substrate in an integral form.

Since sintering of the mullite ceramic according to the present invention proceeds rapidly at a temperature of 1400° C., the melting temperature of the sintering additive for conductive metal must be 1400° C. or higher. From the above facts, it can be understood that the melting temperature of the sintering additive for conductive metal is preferably in the range of 1400° to 1600° C.

The proportions of a mullite powder and a sintering additive for mullite to be incorporated are generally 70 to 85% by weight and 30 to 15% by weight, respectively, and preferably 70 to 80% by weight and 30 to 20% by weight, respectively.

30 to 50% by weight of the above mixture of a mullite powder with a sintering additive for mullite is incorporated with 50 to 70% by weight of additives, i.e., 2 to 5% by weight of an organic binder, 0 to 3% by weight of a plasticizer and 48 to 62% by weight of a dispersant to prepare a slurry.

The organic binder includes polyvinyl butyral resin and acrylic esters, among which the former is preferable. Phthalic esters etc. may be used as the plasticizer, and alcohols (such as ethanol, isopropanol and butanol) etc. may be used as the dispersant.

The green sheet may be prepared, e.g., by coating a base film (carrier tape) with the above-mentioned slurry in a predetermined thickness, drying the resulting coating and peeling off the base film (a so-called doctor blade method). The thickness of the green sheet thus obtained is generally in the range of 0.15 to 0.25 mm.

In order to produce the sintering additives for both mullite and conductive metal having compositions respectively as shown in FIG. 2 and FIG. 3, it is preferred to use $SiO_2$, $Al_2O_3$ and MgO all of which have a purity of 99.5% or above, preferably from 99.9 to below 99.99% and an average particle diameter in the range of 0.5 to 3 $\mu$m, preferably 1 to 2 $\mu$m.

In the present invention, it is required that not only the sintering temperature of a mullite ceramic substrate be as high as 1550° to 1700° C. but also the sintering be conducted in a reducing atmosphere. Therefore, the conductive metal to be used should meet the above two requirements and, at the same time, should be low in electrical resistance. In view of the above, it is necessary that the conductive metal for mullite ceramic meet all the above three requirements. Such metals include tungsten (melting point: about 3500° C.) and molybdenum (melting point: about 2800° C.).

Tungsten and molybdenum conductive paste to be used are those having the compositions as shown in Table 1. The slight difference in the proportions of metal powder and sintering additive and the proportions of the solid component and the liquid component between the two pastes is attributable to the fact that the specific gravity of molybdenum (10.2) is smaller than that of tungsten (19.1).

TABLE 1

| Items | | Tungsten conductive paste range | Tungsten conductive paste preferable range | Molybdenum conductive paste range | Molybdenum conductive paste preferable range |
|---|---|---|---|---|---|
| Conductive metal powder | purity | 99.0~99.99% | more than 99.9% | " | " |
| | average particle diameter | 0.5~3 $\mu$m | 1~2 $\mu$m | 0.5~7 | 1~5 |
| | proportion incorporated | 85~97 wt % | 90~95 wt % | 90~99 | 95~97 |
| Proportion of sintering additive | | 3~15 wt % | 5~10 wt % | 1~10 | 3~5 |

TABLE 1-continued

| Items | | Tungsten conductive paste | | Molybdenum conductive paste | |
|---|---|---|---|---|---|
| | | range | preferable range | range | preferable range |
| Solid component | for conductive metal incorporated proportions of conductive metal component and sintering additive incorporated | 70~90 wt % | 75~85 wt % | 60~85 | 65~80 |
| Proportion of vehicle incorporated (liquid component) | | 10~30 wt % | 15~25 wt % | 15~40 | 20~35 |
| [Kind of vehicle] diethylene glycol n-butyl ether acetate | | 10~22 wt % | 13.8~20 wt % | " | " |
| ethylcellulose | | 0~5 wt % | 1~3 wt % | " | " |
| polyvinyl butyral | | 0~3 wt % | 0.2~2 wt % | " | " |

The present invention will now be described in more detail with reference to the following examples.

EXAMPLE 1

70% by weight of a commercially available pure mullite ($3Al_2O_3,2SiO_2$) powder having an average particle diameter of 2 μm was sufficiently mixed with 30% by weight of a powder of a sintering additive for mullite (particle diameter: 1 to 3 μm) having a composition comprising 60% by weight of $SiO_2$, 30% by weight of $Al_2O_3$ and 10% by weight of MgO by means of a wet ball mill etc. To the mixture were added 3.0% by weight of a polyvinyl butyral as an organic binder, 1.0% by weight of a phthalic ester as a plasticizer and 48% by weight of ethyl alcohol as a molding additive to prepare a slurry. The content of the molding additive in the slurry was about 50% by weight. The slurry thus obtained was formed into a green sheet having a thickness of 0.20 mm by the doctor blade method.

A conductive paste used in wiring the green sheet on its surface by printing was prepared by mixing 92% by weight of a tungsten powder (purity: 99.95%) having an average particle diameter of 2 μm or 85% by weight of a molybdenum powder (purity: 99.95%) having an average particle diameter of 5 μm with an $SiO_2$-$Al_2O_3$-MgO powder (sintering additive for conductive metal) as shown in FIG. 3 according to the present invention in an amount of 8% by weight for tungsten powder and 15% by weight for molybdenum powder.

The sintering additive for conductive metal according to the present invention was prepared by homogeneously mixing 65% by weight of an $SiO_2$ powder (purity: 99.95%; average particle diamter: 2 μm), 25% by weight of an $Al_2O_3$ powder (purity: 99.95%; average particle diameter: 2 μm) and 10% by weight of an MgO powder (purity: 99.95%; average particle diameter: 2 μm).

Subsequently, 80% by weight of a mixture of tungsten with a sintering additive therefor or 80% by weight of a mixture of molybdenum with a sintering additive therefor was homogeneously mixed with 15% by weight of diethylene glycol monobutyl ether acetate, 3% by weight of ethylcellulose and 2% by weight of polyvinyl butyral to obtain a conductive paste.

The conductive paste thus prepared was printed on the surface of the above-mentioned mullite green sheet to form a wiring pattern. The green sheet on which a wiring pattern had been formed was sintered at 1600° C. for 2 hr in a moistened hydrogen atmosphere to obtain a mullite ceramic wiring substrate which had been wired with a tungsten conductor or molybdenum conductor.

Figure 4:
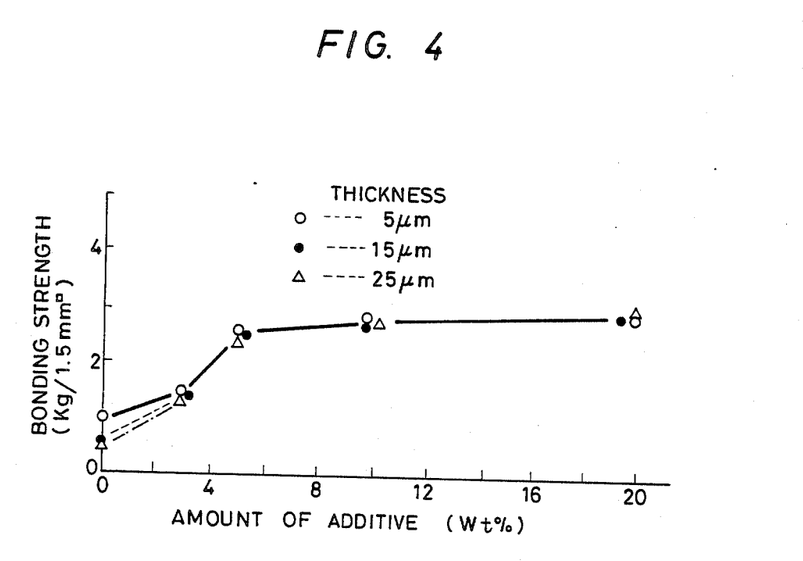
FIG. 4 is a graph showing a relationship among the amount of a sintering additive for conductive metal, the thickness of conductive metal layer and the bonding strength.

FIG. 4 is a graph showing changes in strength (tensile strength) of the bonding between the mullite ceramic substrate and the conductive layer accompanying changes in the sintering additive content (which is indicated in FIG. 4 by the term "AMOUNT OF ADDITIVE") of the tungsten conductor. The sintering additive used had a composition (melting point: 1500° C.) comprising 80% by weight of $SiO_2$, 15% by weight of $Al_2O_3$ and 5% by weight of MgO. As is apparent from FIG. 4, the strength of bonding between the mullite ceramic and the conductor is increased as the amount of the additive contained in the tungsten conductor is increased. Although in a ceramic wiring substrate, a generally accepted strength of the bonding between a substrate and a conductor for practical use is 1 kg of more, a bonding strength of 1.5 kg or more is preferable when a high reliability is required.

Although the bonding strength of conventional ceramic wiring substrates (sintering additive: 0%) is about 1 kg when the thickness of the conductive layer is as thin as 5 μm, the bonding strength is remarkably lowered as the thickness of the conductive layer is 15 μm or more which is a thickness required of a conductor for a wiring substrate. On the other hand, in the ceramic wiring substrate of the present invention, when the sintering additive for conductive metal of the conductor is 3% by weight or more, the strength of bonding between the substrate and the conductor hardly depends on the thickness of the conductive layer and is 1.5 kg or more.

Such a difference in bonding strength between the ceramic wiring substrate of the present invention and the conventional ceramic wiring substrate is attributable to a difference in bonding mechanism. Specifically, in the ceramic wiring substrate of the present invention, the sintering additive for conductive metal added to the conductor exhibits an excellent effect while, in the conventional ceramic wiring substrate, densification of the thick conductive metal layer does not proceed to a satisfactory extent because little or no penetration of the sintering additive into the conductive layer from the side of mullite ceramic can be attained. Judging only from bonding strength the higher the sintering additive content of the conductor, the higher the bonding strength, while judging only from electrical resistance the lower the content of sintering additive which serves as an insulator, the lower the electrical resistance. Therefore, the upper limit of the amount of the sintering additive to be added is 15% by weight. In view of the above, the amount of the sintering additive to be added to the conductor is preferably 3 to 15% by weight, particularly preferably 5 to 15% by weight.

The changes in weight of the sintered substrate due to the permeation of water thereinto were determined with an analytical balance to examine whether the conductive layer had densely been sintered. As a result, it was found that substrates having a conductive layer (thickness: 15 μm and 25 μm) to which no sintering additive had been added exhibited an increase in weight upon being immersed in water while substrates having a conductive layer to which 3% by weight or more of sintering additive had been added exhibited no increase in weight. The above results show that sufficient densification could be attained in a sample to which 3% by weight or more of sintering additive had been added.

Since molybdenum is similar to tungsten in thermal expansion coefficient and chemical properties besides electrical resistance, it has also been used as a conductive material for an alumina ceramic substrate. By the studies of the present inventors, it became apparent that molybdenum can be used as a conductive metal also in a mullite ceramic substrate as in tungsten.

EXAMPLE 2

Sintering additives comprising various compositions as shown in Table 2 were added to the same tungsten powder as the one used in EXAMPLE 1, and conductive pastes were prepared in the same manner as in EXAMPLE 1. Subsequently, the same procedures as in EXAMPLE 1 were repeated to form wiring patterns by printing on the same mullite green sheet as the one used in EXAMPLE 1 using the above-obtained conductive pastes. The green sheets on which wiring patterns had been formed were sintered at 1630° C. for 3 hr in a moistened hydrogen atmosphere. The weight ratio of tungsten to sintering additive for tungsten in the conductor was 9:1, and the thickness of the conductive layer was 23 to 26 μm.

As can be seen from Table 2, in all the mullite ceramic substrates, the strength of bonding between the ceramic substrate and the conductive layer was 2 kg or more.

In view of the results as shown in Table 2 and from the standpoint of easiness in process, it is preferred that the sintering additive have a composition falling within the range surrounded by the lines connecting points T, U, V, F, G, H, I, J and N and the lines connecting points, O, P, Q, R and S as shown in an $SiO_2$-$Al_2O_3$-$MgO$ ternary composition diagram.

TABLE 2

| No. | Composition of sintering additive (wt %) | | | Melting temp. (°C.) | Bonding strength (kg/1.5 mm □) |
|---|---|---|---|---|---|
| | $SiO_2$ | $Al_2O_3$ | $MgO$ | | |
| 1 | 55 | 7 | 38 | 1600 | 2.1 |
| 2 | 42 | 22 | 36 | 1600 | 2.1 |
| 3 | 46 | 40 | 14 | 1580 | 2.3 |
| 4 | 60 | 30 | 10 | 1550 | 2.7 |
| 5 | 95 | 5 | 0 | 1590 | 1.9 |
| 6 | 70 | 15 | 15 | 1500 | 2.9 |
| 7 | 65 | 20 | 15 | 1400 | 2.5 |
| 8 | 50 | 30 | 20 | 1540 | 2.3 |
| 9 | 50 | 20 | 30 | 1470 | 2.7 |
| 10 | 80 | 13 | 7 | 1550 | 2.5 |
| 11 | 80 | 16 | 4 | 1510 | 2.3 |

EXAMPLE 3

90% by weight of a molybdenum powder having an average particle diameter of 2 μm as a conductive metal was incorporated with 10% by weight of a sintering additive for conductive metal (composition: $SiO_2$:70% by weight, $Al_2O_3$: 20% by weight and $MgO$: 10% by weight; melting temperature: 1480° C.), and the same procedures as in EXAMPLE 1 were repeated to prepare a conductive paste therefrom. Subsequently, the same procedures as in EXAMPLE 1 were repeated to form a wiring pattern by printing on the same mullite green sheet as used in EXAMPLE 1 using the above-obtained conductive paste. The green sheet on which a wiring pattern had been formed was sintered at 1560° C. for 2 hr in a moistened hydrogen atmosphere. The thickness of the conductive layer was 20 μm.

A water absorptivity of the mullite ceramic wiring substrate thus obtained was determined in the same manner as in EXAMPLE 1. As a result, it was found that no increase in weight was caused, i.e., a dense conductive layer was formed. Subsequently, the strength of bonding between the ceramic substrate and the conductive layer was determined. As a result, it was found that the bonding strength was 2.5 to 4.3 kg, i.e., the substrate had a bonding strength enough to be put into practical use.

The same excellent results as those obtained above could be obtained in the composition ranges of the material and sintering conditions used in the present invention.

EXAMPLE 4

90% by weight of the same tungsten powder as in EXAMPLE 1 was incorporated with 10% by weight of a sintering additive having a composition comprising 50% by weight of $SiO_2$, 25% by weight of $Al_2O_3$ and 25% by weight of $MgO$ and having a melting temperature of 1420° C., and the same procedures as in EXAMPLE 1 were repeated to prepare a conductive paste. Subsequently, the same procedures as in EXAMPLE 1 were repeated to form a wiring pattern by printing on the same mullite green sheet as used in EXAMPLE 1 using the above-obtained conductive paste. The green sheet on which a wiring pattern had been formed was sintered at 1680° C. for 1 hr in a moistened hydrogen atmosphere to obtain a mullite ceramic wiring substrate. The conductive layer of the mullite ceramic wiring substrate thus obtained was dense and exhibited no water absorptivity. The strength of bonding between the ceramic and the conductor was in the range of 2.1 to 3.7 kg (layer thickness: 25 μm), i.e., was far better than that of the wiring substrate which was produced using a conductor to which no sintering additive had been added.

The same excellent results as those obtained above could be obtained in the composition ranges of the material and sintering conditions used in the present invention.

As is apparent from the foregoing, according to the present invention, not only the strength of bonding between the mullite ceramic and the conductive metal layer can remarkably be improved, but also a dense conductive metal layer can be obtained. This improves reliability with respect to various characteristics of a ceramic wiring substrate to a great extent and, at the same time, has excellent effects of improving stability in a substrate producing process and yield.

What is claimed is:

1. A ceramic wiring substrate comprising a conductive layer provided on a ceramic substrate, said conductive layer being produced by sintering a conductive paste comprising 85 to 97% by weight of a tungsten powder and 15 to 3% by weight of a sintering additive (for conductive metal) having a composition falling within the range surrounded by the lines connecting points A, B, C, D, E, F, G, H, I, J, K, L, M and N and the lines connecting points O, P, Q, R and S in a triangular composition diagram, provided that said points A through N and O through S represent the following compositions, respectively:

|   | SiO$_2$ (wt %) | Al$_2$O$_3$ (wt %) | MgO (wt %) |
|---|---|---|---|
| A | 46 | 41 | 13 |
| B | 41 | 22.5 | 36.5 |
| C | 47 | 17 | 36 |
| D | 51 | 12 | 37 |
| E | 56 | 5 | 39 |
| F | 60 | 5 | 35 |
| G | 67 | 5 | 28 |
| H | 71 | 9 | 21 |
| I | 75 | 12 | 13 |
| J | 80 | 12 | 8 |
| K | 84 | 10 | 6 |
| L | 90 | 7.5 | 2.5 |
| M | 95 | 5 | 0 |
| N | 80 | 16 | 4 |
| O | 51 | 26 | 23 |
| P | 50.5 | 23 | 26.5 |
| Q | 55.5 | 18 | 26.5 |
| R | 63 | 15 | 22 |
| S | 64 | 20 | 16 |

2. A ceramic wiring substrate comprising a conductive layer provided on a ceramic substrate, said conductive layer being produced by sintering a conductive paste comprising 75 to 95% by weight of a molybdenum powder and 5 to 25% by weight of a sintering additive (for conductive metal) having a composition falling within the range surrounded by the lines connecting points A, B, C, D, E, F, G, H, I, J, K, L, M and N and the lines connecting points O, P, Q, R and S in a triangular composition diagram, provided that said points A through N and O through S represent the following compositions, respectively:

|   | SiO$_2$ (wt %) | Al$_2$O$_3$ (wt %) | MgO (wt %) |
|---|---|---|---|
| A | 46 | 41 | 13 |
| B | 41 | 22.5 | 36.5 |
| C | 47 | 17 | 36 |
| D | 51 | 12 | 37 |
| E | 56 | 5 | 39 |
| F | 60 | 5 | 35 |
| G | 67 | 5 | 28 |
| H | 71 | 9 | 21 |
| I | 75 | 12 | 13 |
| J | 80 | 12 | 8 |
| K | 84 | 10 | 6 |
| L | 90 | 7.5 | 2.5 |
| M | 95 | 5 | 0 |
| N | 80 | 16 | 4 |
| O | 51 | 26 | 23 |
| P | 50.5 | 23 | 26.5 |
| Q | 55.5 | 18 | 26.5 |
| R | 63 | 15 | 22 |
| S | 64 | 20 | 16 |

3. A ceramic wiring substrate according to claim 1 or 2, wherein said ceramic substrate is a sintered material comprising pure mullite and a sintering additive for said mullite.

4. A ceramic wiring substrate according to claim 1 or 2, wherein said ceramic substrate is a sintered material comprising 70 to 85% by weight of pure mullite and 30 to 15% by weight of a sintering additive for said mullite having a composition falling within the range surrounded by the lines connecting points a, b, c and d in a triangular composition diagram, provided that said points a through d represent the following compositions, respectively:

|   | SiO$_2$ (wt %) | Al$_2$O$_3$ (wt %) | MgO (wt %) |
|---|---|---|---|
| a | 60 | 30 | 10 |
| b | 86 | 4 | 10 |
| c | 95 | 4 | 1 |
| d | 69 | 30 | 1 |

5. A process for producing a ceramic wiring substrate, comprising the steps of:

conducting printing on a ceramic green sheet with a conductive paste comprising 85 to 97% by weight of a tungsten powder and 15 to 3% by weight of a sintering additive (for conductive metal) having a composition falling within the range surrounded by the lines connecting points A, B, C, D, E, F, G, H, I, J, K, L, M and N and the lines connecting points O, P, Q, R and S in a triangular composition diagram; and sintering the resulting ceramic green sheet having a printing thereon at 1550° to 1700° C. in a reducing atmosphere, provided that said points A through N and O through S represent the following compositions, respectively:

|   | SiO$_2$ (wt %) | Al$_2$O$_3$ (wt %) | MgO (wt %) |
|---|---|---|---|
| A | 46 | 41 | 13 |
| B | 41 | 22.5 | 36.5 |
| C | 47 | 17 | 36 |
| D | 51 | 12 | 37 |
| E | 56 | 5 | 39 |
| F | 60 | 5 | 35 |
| G | 67 | 5 | 28 |
| H | 71 | 9 | 21 |
| I | 75 | 12 | 13 |
| J | 80 | 12 | 8 |
| K | 84 | 10 | 6 |
| L | 90 | 7.5 | 2.5 |
| M | 95 | 5 | 0 |
| N | 80 | 16 | 4 |
| O | 51 | 26 | 23 |
| P | 50.5 | 23 | 26.5 |
| Q | 55.5 | 18 | 26.5 |
| R | 63 | 15 | 22 |
| S | 64 | 20 | 16 |

6. A process for producing a ceramic wiring substrate, comprising the steps of:

conducting printing on a ceramic green sheet with a conductive paste comprising 75 to 95% by weight of a tungsten powder and 25 to 5% by weight of a sintering additive (for conductive metal) having a composition falling within the range surrounded by the lines connecting points A, B, C, D, E, F, G, H, I, J, K, L, M and N and the lines connecting points O, P, Q, R and S in a triangular composition diagram; and sintering the resulting ceramic green sheet having a printing thereon at 1550° to 1700° C. in a reducing atmosphere, provided that said points A through N and O through S represent the following compositions, respectively:

|   | SiO$_2$ (wt %) | Al$_2$O$_3$ (wt %) | MgO (wt %) |
|---|---|---|---|
| A | 46 | 41 | 13 |
| B | 41 | 22.5 | 36.5 |
| C | 47 | 17 | 36 |
| D | 51 | 12 | 37 |
| E | 56 | 5 | 39 |
| F | 60 | 5 | 35 |
| G | 67 | 5 | 28 |
| H | 71 | 9 | 21 |
| I | 75 | 12 | 13 |
| J | 80 | 12 | 8 |
| K | 84 | 10 | 6 |
| L | 90 | 7.5 | 2.5 |
| M | 95 | 5 | 0 |
| N | 80 | 16 | 4 |
| O | 51 | 26 | 23 |
| P | 50.5 | 23 | 26.5 |
| Q | 55.5 | 18 | 26.5 |
| R | 63 | 15 | 22 |

-continued

|   | SiO$_2$ (wt %) | Al$_2$O$_3$ (wt %) | MgO (wt %) |
|---|---|---|---|
| S | 64 | 20 | 16 |

7. A process according to claim 5 or 6, wherein said ceramic green sheet is a composition consisting essentially of pure mullite and a sintering additive for said pure mullite.

8. A process according to claim 5 or 6, wherein said ceramaic green sheet is a composition comprising 70 to 85% by weight of pure mullite and 30 to 15% by weight of a sintering additive for said pure mullite having a composition falling within the range surrounded by the lines connecting points a, b, c and d in a triangular composition diagram, provided that said points a through d represent the following compositions, respectively:

|   | SiO$_2$ (wt %) | Al$_2$O$_3$ (wt %) | MgO (wt %) |
|---|---|---|---|
| a | 60 | 30 | 10 |
| b | 86 | 4 | 10 |
| c | 95 | 4 | 1 |
| d | 69 | 30 | 1 |

* * * * *